United States Patent [19]
Harkins et al.

[11] Patent Number: 5,332,974
[45] Date of Patent: Jul. 26, 1994

[54] NETWORK ANALYZER PERFORMANCE VERIFICATION

[75] Inventors: Daniel R. Harkins; Paul R. Hernday; Roger W. Wong; William T. Pike; Paul S. Stafford, all of Santa Rosa, Calif.

[73] Assignee: Hewlett-Packard Company, Palo Alto, Calif.

[21] Appl. No.: 518,042

[22] Filed: May 1, 1990

[51] Int. Cl.$^5$ ............................................. G01R 35/00
[52] U.S. Cl. ................................. 324/606; 324/612; 364/571.05
[58] Field of Search ................. 324/601, 74, 606, 605, 324/612; 364/571.04, 571.05; 356/73.1; 250/252.1 A, 252.1 R

[56] References Cited

U.S. PATENT DOCUMENTS

| | | | |
|---|---|---|---|
| 3,904,959 | 9/1975 | Britton, Jr. | 324/606 |
| 4,189,778 | 2/1980 | Vogel | 324/606 |
| 4,200,933 | 4/1980 | Nickel et al. | |
| 4,475,079 | 10/1984 | Gale | 324/606 |
| 4,481,596 | 11/1984 | Townzen | 364/571.05 |
| 4,685,799 | 8/1987 | Brininstool | 356/73.1 |
| 4,812,738 | 3/1989 | Itaya et al. | 324/601 |
| 4,839,578 | 6/1989 | Roos | 324/601 |
| 4,845,423 | 7/1989 | Pollard | 324/74 |
| 4,890,278 | 12/1989 | Felker et al. | 364/571.05 |
| 4,952,057 | 8/1990 | Kamikawa et al. | 356/73.1 |
| 4,970,671 | 11/1990 | Rosenthal | 364/571.05 |

Primary Examiner—Kenneth A. Wieder
Assistant Examiner—Maura K. Regan
Attorney, Agent, or Firm—William C. Milks, III

[57] ABSTRACT

A method to verify that a test and measurement system continues to operate within a predetermined acceptable range with respect to a given calibrated state previously defined for that system without the need for conventional external reference components. In accordance with one embodiment, performance verification of a network analyzer used to perform electrical measurements is achieved by storing RF "thru" measurement data (an RF thru measurement trace of the system) at the time of calibration at the factory or later repair and/or recalibration at a field service site. In accordance with another embodiment, performance verification of a lightwave component analyzer, used to perform electrical, electro-optical, opto-electrical, and optical measurements, is achieved by storing RF and optical thru measurement data (both an RF thru measurement trace of the system and an optical thru measurement trace of the system) at the time of calibration at the factory or later repair and/or recalibration. In both cases, at the time of manufacture, the key measurement paths (with calibrated reference components in the loop) of the test and measurement system are measured and stored in system memory or, alternatively, on a disc that is shipped with the system. Repeating these measurements with the same thru connection(s) at a later time(s) indicates how well the test and measurement system is reproducing the conditions of its initial calibration. Setting a range of allowable deviation (for measurement repeatability and normal system drift) between the initial and any later measurements establishes limits within which the integrity of the test and measurement system hardware performance is assured for subsequent measurements on an unknown device under test.

18 Claims, 16 Drawing Sheets

NETWORK ANALYZER PERFORMANCE VERIFICATION

BACKGROUND OF THE INVENTION

This invention relates to electronic test and measurement systems for precisely measuring the performance characteristics of unknown devices under test and, more particularly, to techniques for assuring, with a relatively high probability, that such systems are able to perform calibrated performance measurements on test devices. Specifically, one embodiment of the invention is directed to a method for verifying that a test and measurement system continues to operate within a predetermined acceptable range with respect to a given calibrated state previously defined for that system. This method can be applied to verification of test and measurement systems for performing electrical, as well as electro-optical, opto-electrical, and optical, performance measurements on a device under test.

Factory calibration of a radio-frequency (RF)/microwave test and measurement system, or network analyzer, for measuring the performance characteristics of an unknown device under test assures system integrity, such as receiver linearity, frequency accuracy, and measurement dynamic range, at the time of manufacture. The network analyzer can also be recalibrated when it is later maintained or repaired.

Additionally, a conventional network analyzer is typically subjected to a measurement calibration process just prior to the time that a user performs a measurement on an unknown device under test. The calibration measurement involves measuring various calibration standards. These calibration standards comprise reference components, such as a short-circuit, an open-circuit, a known termination (e.g., a load), etc., whose electrical properties have been previously measured on a calibrated network analyzer and whose performance characteristics are therefore precisely known. These calibration standards are sequentially connected to the actual network analyzer being used and are then measured, and any differences between the calibration measurement data and the expected measurement data are used as error correction data when the performance characteristics of an unknown device under test are subsequently measured. However, the quality of the measurement performed by the user is not only dependent on the quality of the reference components of the calibration kit and the quality of the user's measurement procedures, but also is dependent on the network analyzer hardware performance.

Consequently, in order to verify the performance of network analyzer measurements, after the foregoing calibration measurement process is completed, a verification kit is typically used. The verification kit comprises a set of reference components and, additionally, accompanying performance characterization data for these components, that are previously measured on a calibrated network analyzer. Typically, the reference components incorporated into the verification kit comprise highly precise components similar to the calibration standards used to calibrate a network analyzer. Comparison of the accompanying performance characterization data with data later measured by the actual network analyzer being used after undergoing a calibration measurement is employed to predict (with reasonable probability) the integrity of subsequent network analyzer measurements on unknown devices under test.

However, manufacture and characterization of the reference components of verification kits is difficult. Moreover, the cost of verification kits is relatively high. Furthermore, the user is required to not only purchase such a costly verification kit, but also to maintain it and assure that it remains with the network analyzer so that the additional verification process can be performed.

Furthermore, unlike the case of conventional electrical measurements, the concept of verification for electrical/optical measurements poses a significant additional challenge. The availability of representative devices to use as calibration or verification kit reference components is uncertain. In any event, to provide a complete verification would be extremely costly, and probably prohibitively expensive, in the case of an electrical/optical network analyzer, or lightwave component analyzer. However, without a calibration or verification kit being available to provide a traceable measurement solution, it is not possible for the user to gain confidence in the integrity of lightwave component analyzer performance measurements on unknown devices under test.

SUMMARY OF THE INVENTION

The present invention generally solves this problem by providing a verification method that does not depend on measurements on conventional external reference components. Rather, it depends on monitoring the test and measurement system hardware performance to detect deviations, or changes, over time as compared to the system status at the time of factory or other reference calibration.

More particularly, one embodiment of the invention provides a method to verify that a test and measurement system continues to operate within a predetermined acceptable range with respect to a given calibrated state previously defined for that system without the need for conventional external reference components. This method can be applied to verification of test and measurement systems for performing electrical and/or electro-optical, opto-electrical, and optical measurements on unknown devices under test.

In accordance with one embodiment of the invention, performance verification of a test and measurement system in the form of a network analyzer used to perform electrical measurements is achieved by storing RF "thru" measurement data (an RF thru measurement trace of the system) at the time of calibration at the factory or later repair and/or recalibration at a field service site. In accordance with another embodiment of the invention, performance verification of a test and measurement system in the form of a lightwave component analyzer, used to perform electrical, electro-optical, opto-electrical, and optical measurements, is achieved by storing RF and optical thru measurement data (both an RF thru measurement trace of the system and an optical thru measurement trace of the system) at the time of calibration at the factory or later repair and/or recalibration. In both cases, at the time of manufacture, the key measurement paths (with calibrated reference components in the loop) of the test and measurement system are measured and stored in system memory or, alternatively, on a disc that is shipped with the system. Repeating these measurements with the same thru connection(s) at a later time(s) indicates how well the test and measurement system is reproducing the conditions of its initial calibration. Setting a range of allowable deviation (for measurement repeatability and normal system drift) establishes limits within which the integrity of the test and measurement system hardware performance is assured. This provides user confidence in subsequent measurements on unknown devices under test.

Accordingly, verification is accomplished without the need for a conventional verification kit by simply repeating the thru measurement(s) and comparing the measured data with previously stored data. Differences between the initial and later measurements indicate the test and measurement system drift, repeatability, and deviation from the earlier calibrated (initial calibration) state.

This approach results in a simple method for performing a test and measurement system verification. It replaces the traditional technique of top-down verification based on measuring a plurality of conventional external reference components to estimate the status of test and measurement system performance. It also provides a method to verify performance in situations where reference components are not readily available (such as electrical/optical devices). It provides a vehicle for performing verification with increased confidence in the test and measurement system status, as well as insight to a path linked directly back to the initial system calibration. This can provide a higher level of integrity than repeated measurements by the user on reference components.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings.

DETAILED DESCRIPTION OF THE PREFERRED EMBODIMENTS

In accordance with various embodiments of the verification method of the invention, test and measurement system hardware performance is monitored to detect deviations over time as compared to the system status at the time of earlier calibration. For example, at the time of manufacture, the critical measurement paths (with calibrated reference components in the loop) of the test and measurement system are measured using a thru connection(s) and stored in system memory or on a disc that is shipped with the system. Occasionally repeating this measurement(s) over time indicates how well the system is reproducing the conditions of its initial calibration. Setting limits of allowable deviation (for measurement repeatability and normal system drift) establishes bounds within which the user can have confidence that the test and measurement system can perform a calibrated measurement on an unknown device under test. If the bounds are exceeded, the user can schedule maintenance/repair of the test and measurement system.

In accordance with one embodiment of the verification method of the invention, verification is provided for a network analyzer which performs electrical performance measurements. For example, such a verification method can be incorporated into a network analyzer generally indicated by the numeral 10 shown in FIG. 1.

The network analyzer 10 can be, for example, an HP 8752 RF network analyzer system available from Hewlett-Packard Company, Network Measurements Division, Santa Rosa, Calif. An initial calibration is stored in the system memory at the time of manufacture. This provides a system that is pre-calibrated so that it is simpler for a user to perform calibrated measurements, although the trade-off is lower performance or degradation of system specifications. However, the user can perform a conventional measurement calibration process with a calibration kit, if desired. This produces error-corrected measurements when an unknown device under test is later measured.

In accordance with the invention, an expanded verification method is additionally provided for the network analyzer 10, which comprises measuring an open-circuit, a short-circuit, and a load, as well as a thru connection. These reference components are preferably measured at the factory at the time of initial calibration of the network analyzer 10, and the initial measurement data are stored in system memory. The reference components are then incorporated into a type-N calibration kit available with the network analyzer 10. Thereafter, a user can re-measure the reference components, and the network analyzer 10 can compare the quality of the measured results (in this case depending on the specified characteristics of the reference components being measured) to expected test results.

Figure 1:
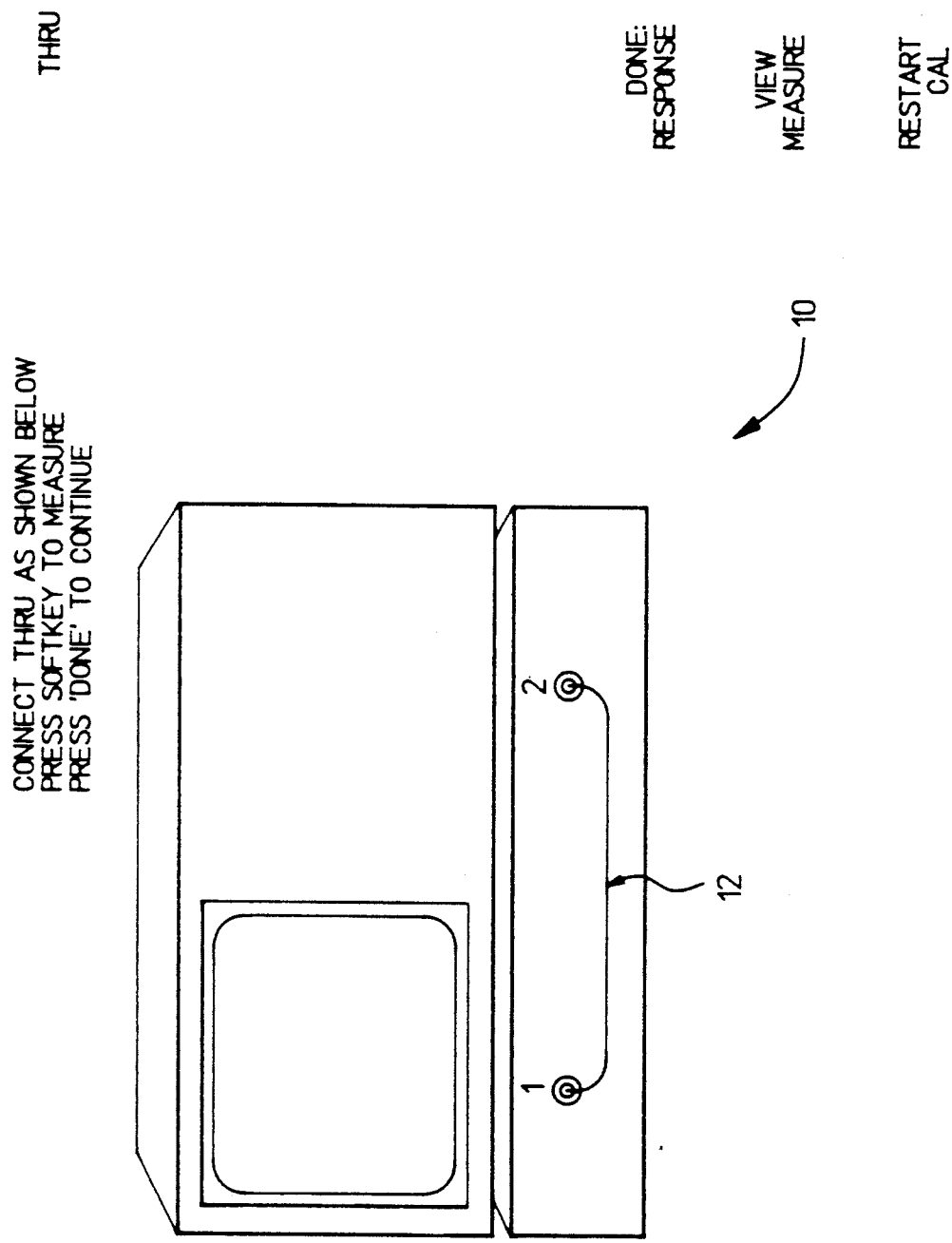
FIG. 1 illustrates a network analyzer verification setup in accordance with one embodiment of the method of the invention.

Although the verification process is in some respects similar to the use of a conventional verification process in that it measures conventional external reference components in the form of a short-circuit, an open-circuit, and a load, in accordance with the verification method of the invention, a thru in the form of an RF cable 12, as shown in FIG. 1, is measured at the time of initial calibration. Repetition of the thru measurement at later times provides an indication over time of the status of the hardware of the network analyzer 10, such as drift, repeatability, etc., not previously segregated from measurements which necessarily factor in the electrical properties of a conventional external reference component.

Figure 2:
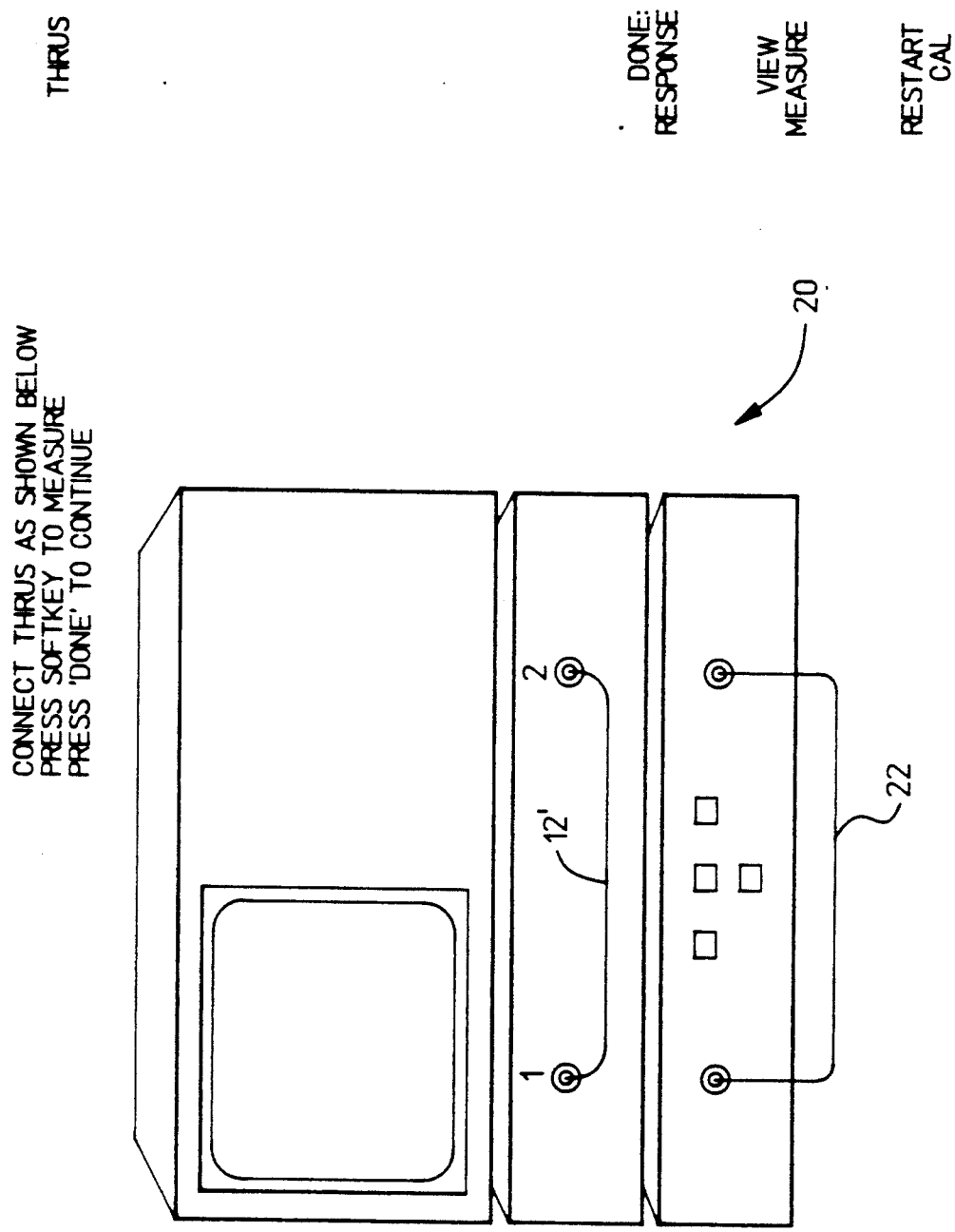
FIG. 2 illustrates a lightwave component analyzer verification setup in accordance with another embodiment of the method of the invention.

In accordance with another embodiment of the invention, a verification method is provided for a lightwave component analyzer generally indicated by the numeral 20 shown in FIG. 2. For example, the lightwave component analyzer 20 can be an HP 8703A lightwave component analyzer or an HP 83420A lightwave test set that provides the ability to perform HP 8703A-type electro-optical measurements with existing microwave network analyzers, both available from the Network Measurements Division of Hewlett-Packard Company.

In accordance with the verification method of the invention, an initial calibration of the lightwave component analyzer 20 is conducted at the time of manufacture, and RF and optical thru measurement data (both an RF thru measurement trace of the system and an optical thru measurement trace of the system) measured at the time of calibration at the factory are stored on a disc which, together with the thru connections, is shipped with the lightwave component analyzer. In the field, at the time of verification, an RF cable 12' and an optical thru in the form of an optical cable 22 are again connected, as shown in FIG. 2. Thus, the external connections required for the verification are: a 3.5 mm (f) flexible electrical cable (HP 8513E) connected between PORT 1 and PORT 2 and a 40 cm optical cable (part of the shipment) connected between the OPTICAL OUTPUT and OPTICAL INPUT. Additionally, an external connection to a 3.5" disc drive (HP 9122C) (not shown) is also required.

Four verification measurements performed are as follows. The measured verification data is the ratio measured data of four hardware paths in the lightwave component analyzer 20, that represent the measurement paths used to perform electro-optical measurements.

Figure 3A:
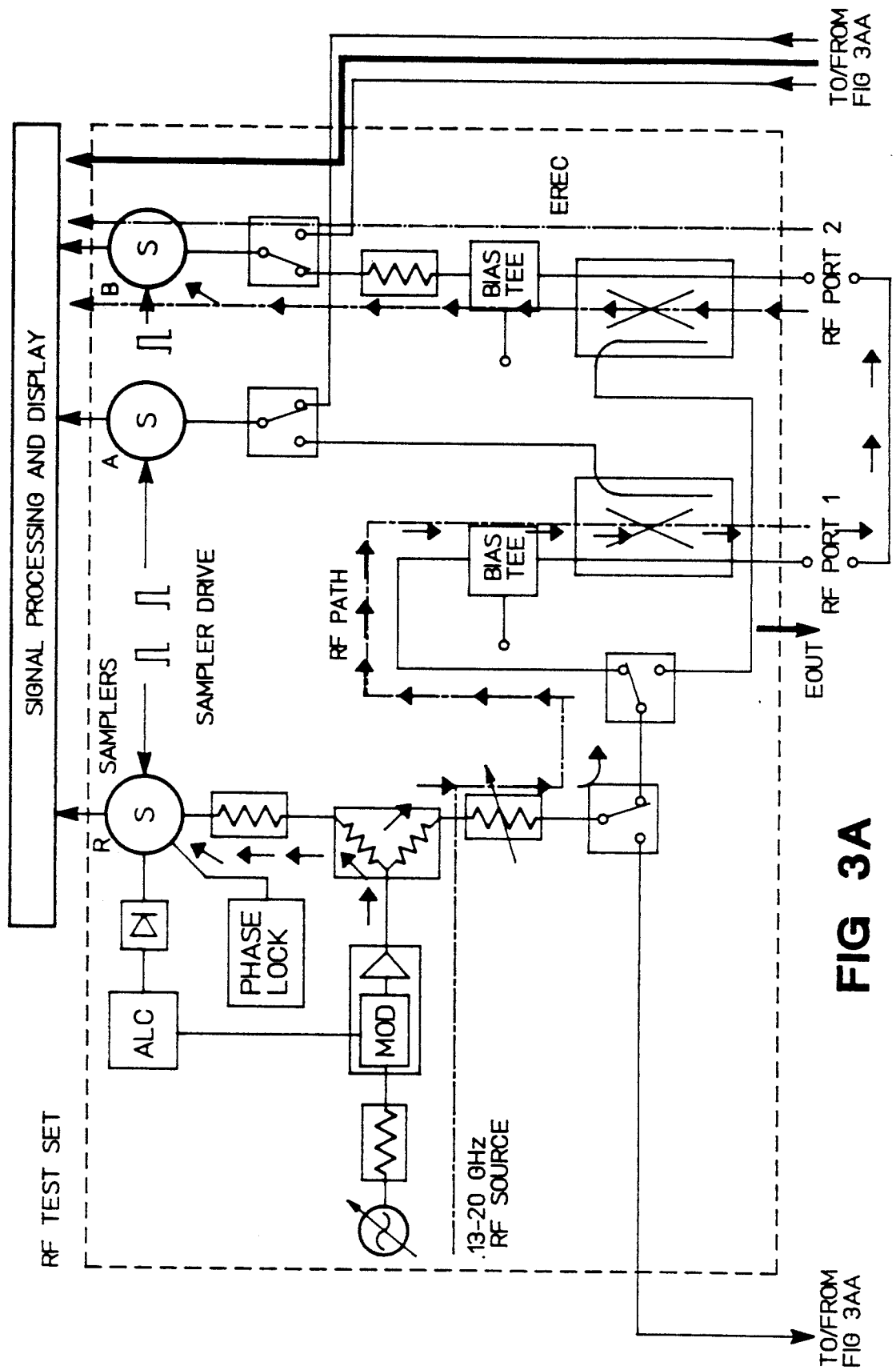
FIG. 3, comprising FIGS. 3A-3AA, FIGS. 3B-3BB, FIGS. 3C-3CC, and FIGS. 3D-3DD, includes block diagrams illustrating four verification paths in the lightwave component analyzer shown in FIG. 2.
Figure 3A:
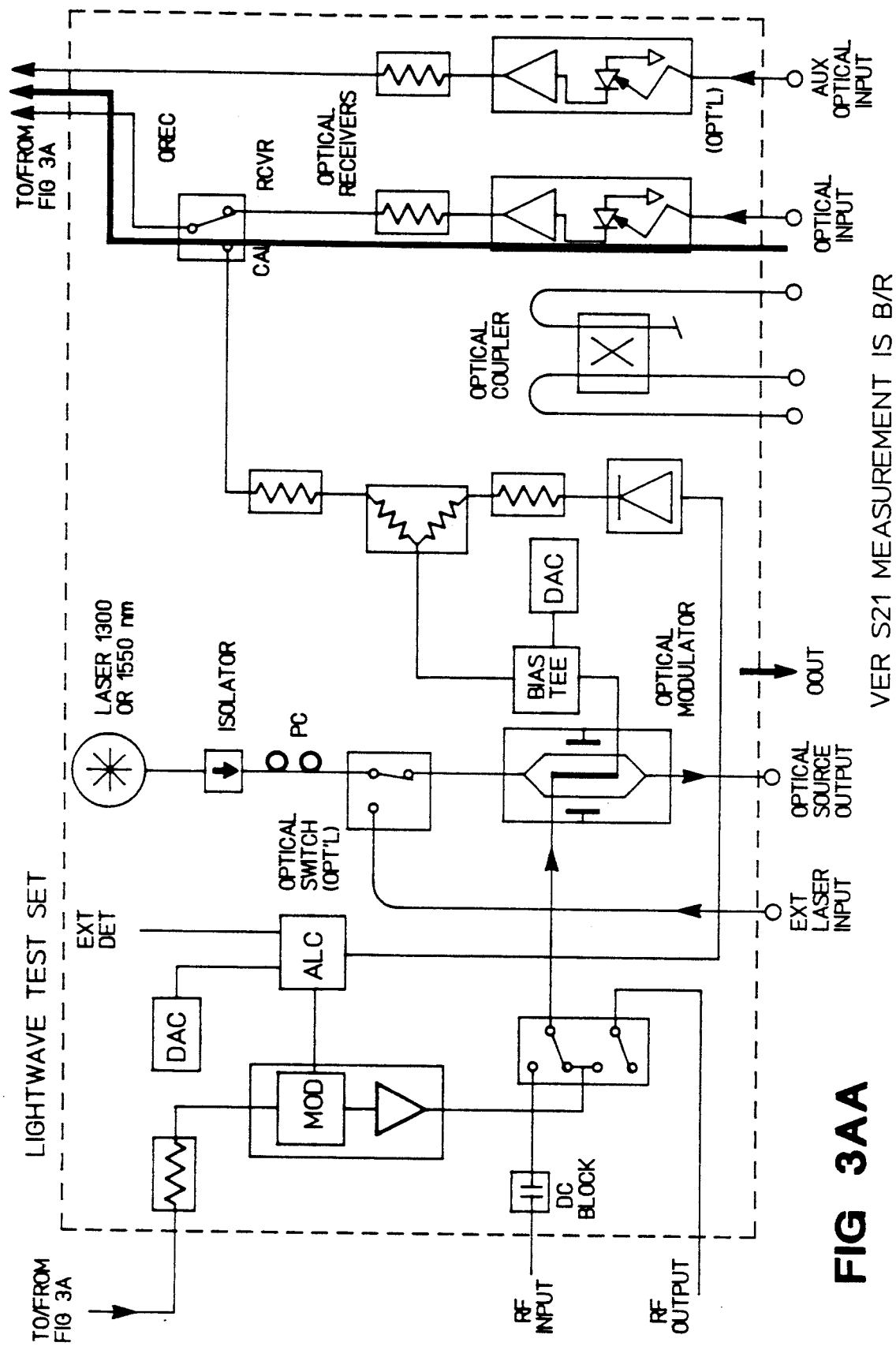

First, an electrical $S_{21}$ measurement is performed using the electrical thru connection. This measurement is compared to the stored measurement to monitor the combination of the electrical drive used in an electro-optical (E/O) mode (RF source power output to PORT 1) and the input test port used in receiver measurements in an opto-electrical (O/E) mode (transmitted power to PORT 2 and hence to B-channel), as shown in FIGS. 3A-3AA.

Figure 3B:
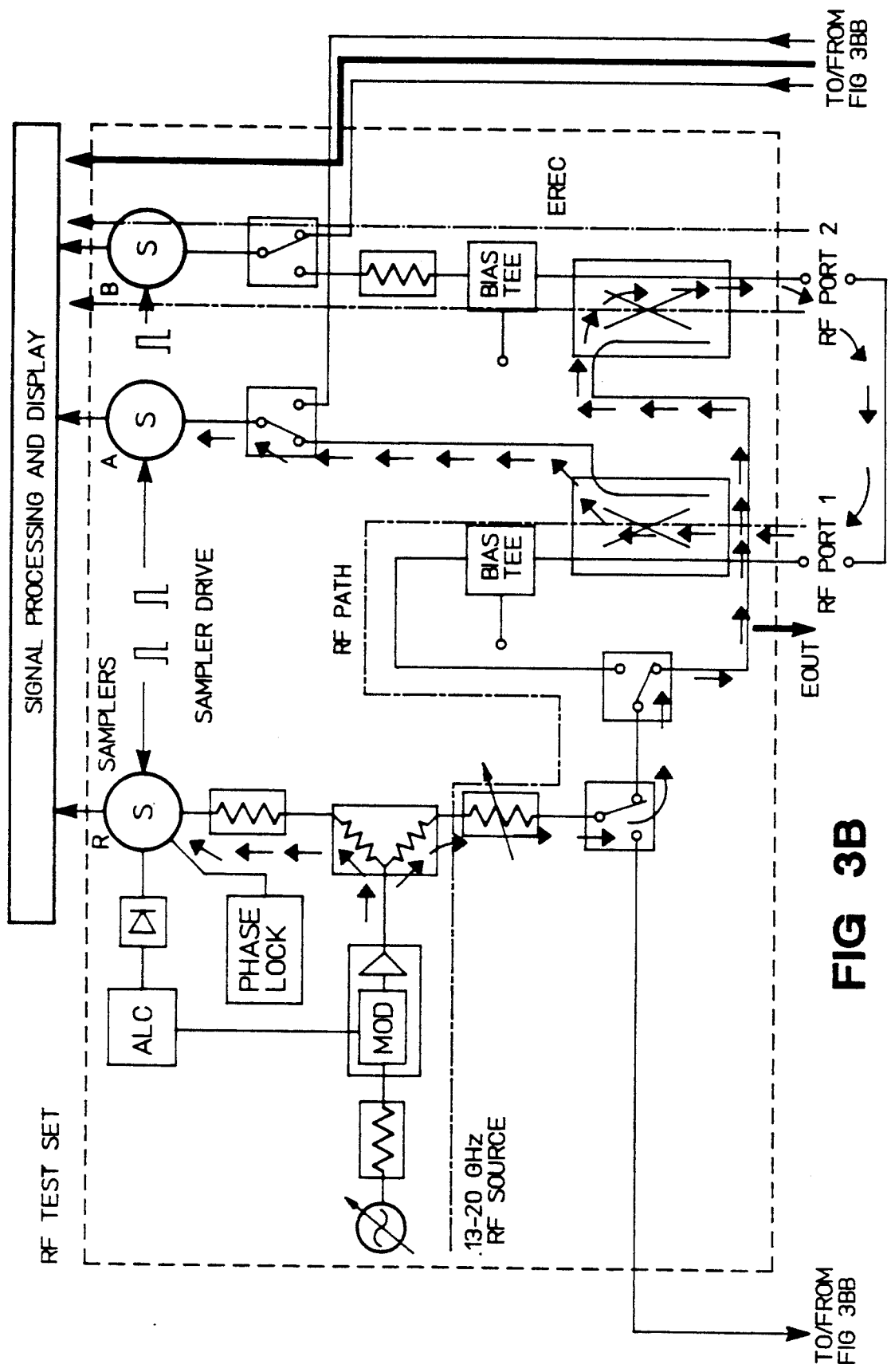
Figure 3B:
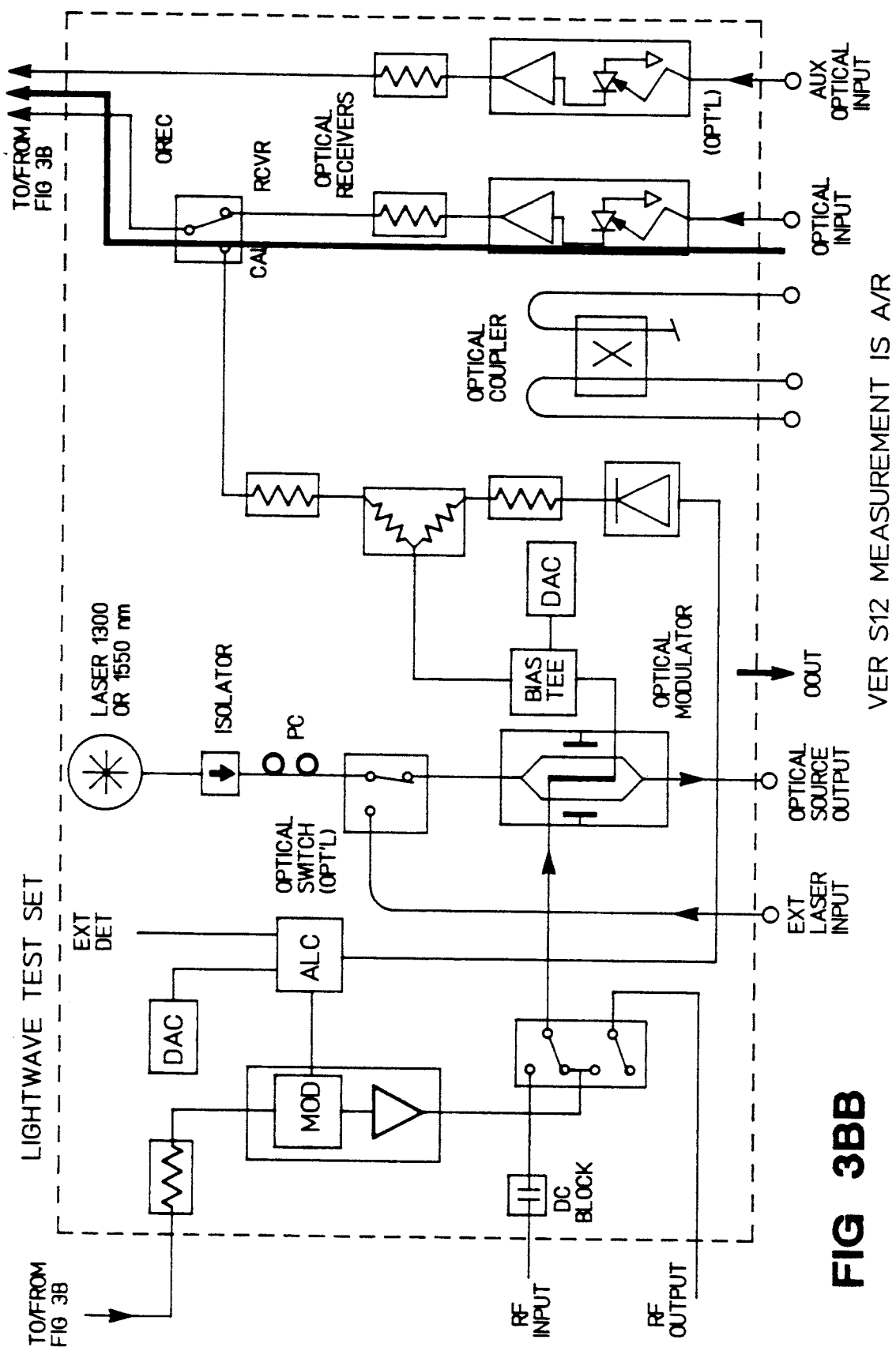

The second measurement is an electrical $S_{12}$ measurement in which the RF source power output is switched from PORT 1 to PORT 2 and the input test port for transmitted power is switched from PORT 2 to PORT 1 and hence to A-channel, as shown in FIGS. 3B-3BB. This measurement is compared to the stored measurement to verify the path for an optional mode that allows the user to switch input and output ports for E/O and O/E measurements.

Figure 3C:
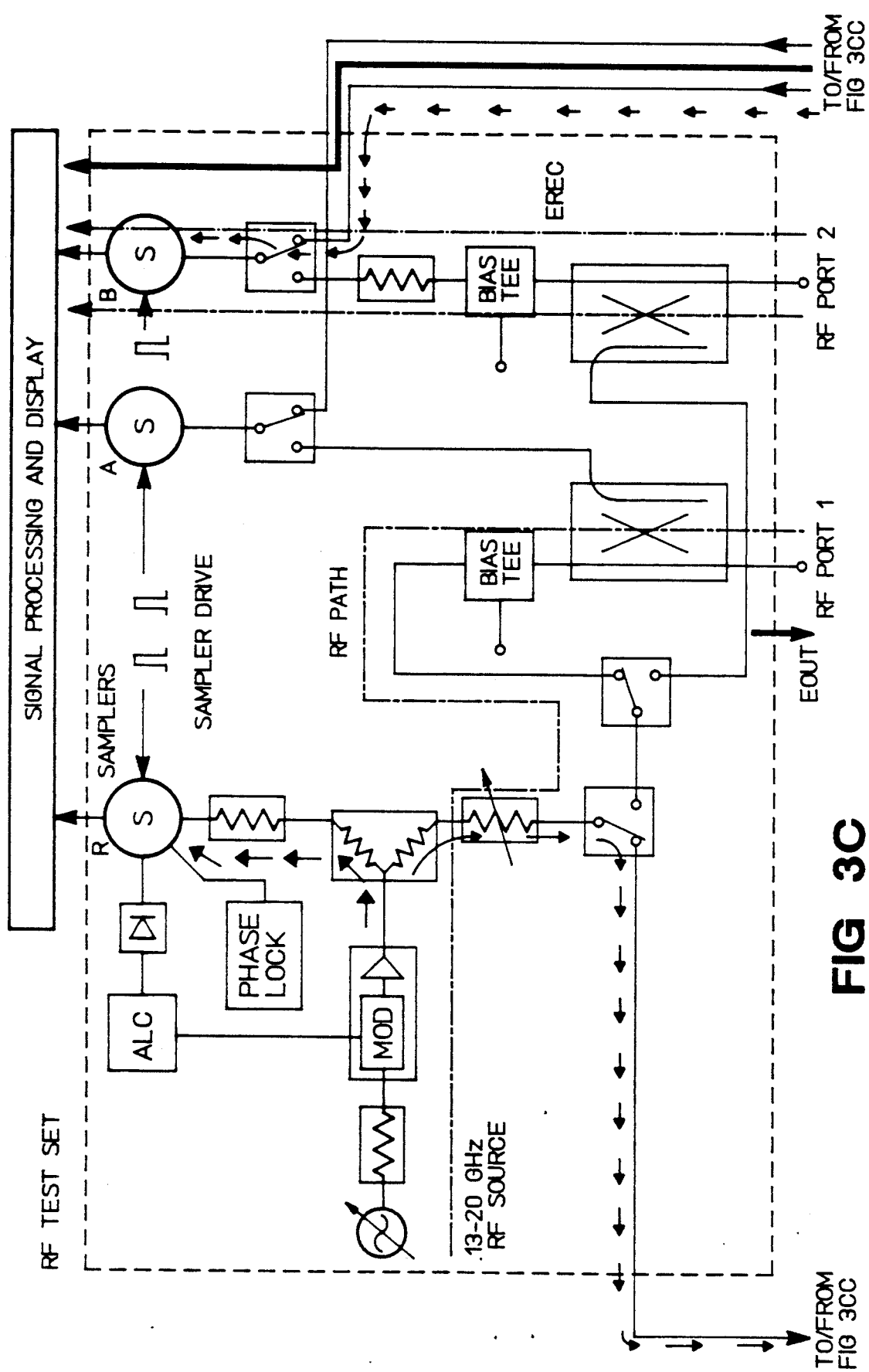
Figure 3C:
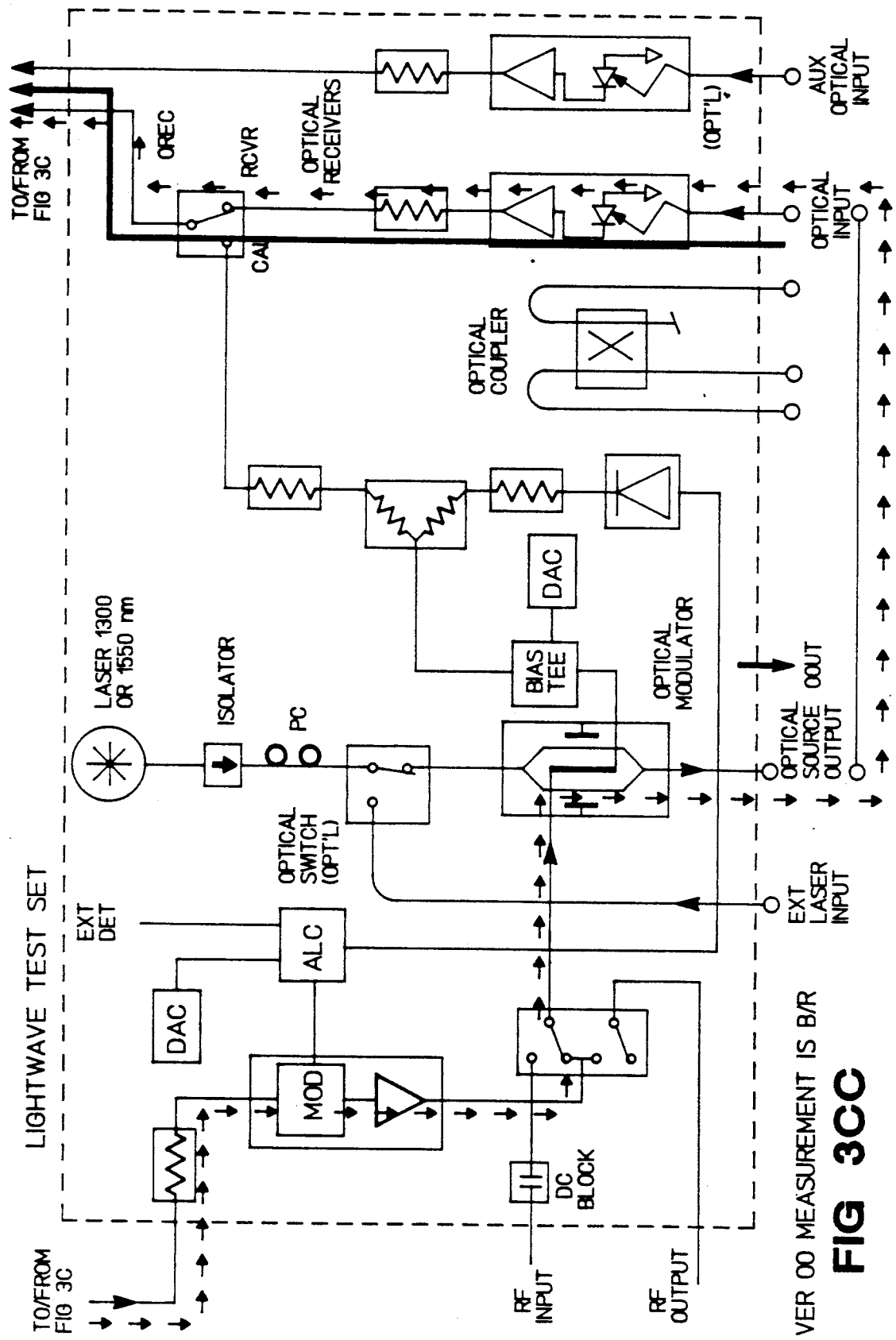

The third measurement measures the optical (O/O) path through the optical thru connection from the optical source, such as a resident laser source, to a photodiode receiver and hence to B-channel, as shown in FIGS. 3C-3CC. This measures the electrical source drive to the optical modulator, output of the laser source, optical reference receiver, and RF path to B-channel. This measurement indicates the basic performance of the optical system. Its primary goal is to assure proper lightwave component analyzer performance levels and thus optical dynamic range. Actually, O/O measurements are referenced to the thru calibration. Therefore, they are relative measurements and do not depend on an absolute calibration being resident in the lightwave component analyzer 20.

Figure 3D:
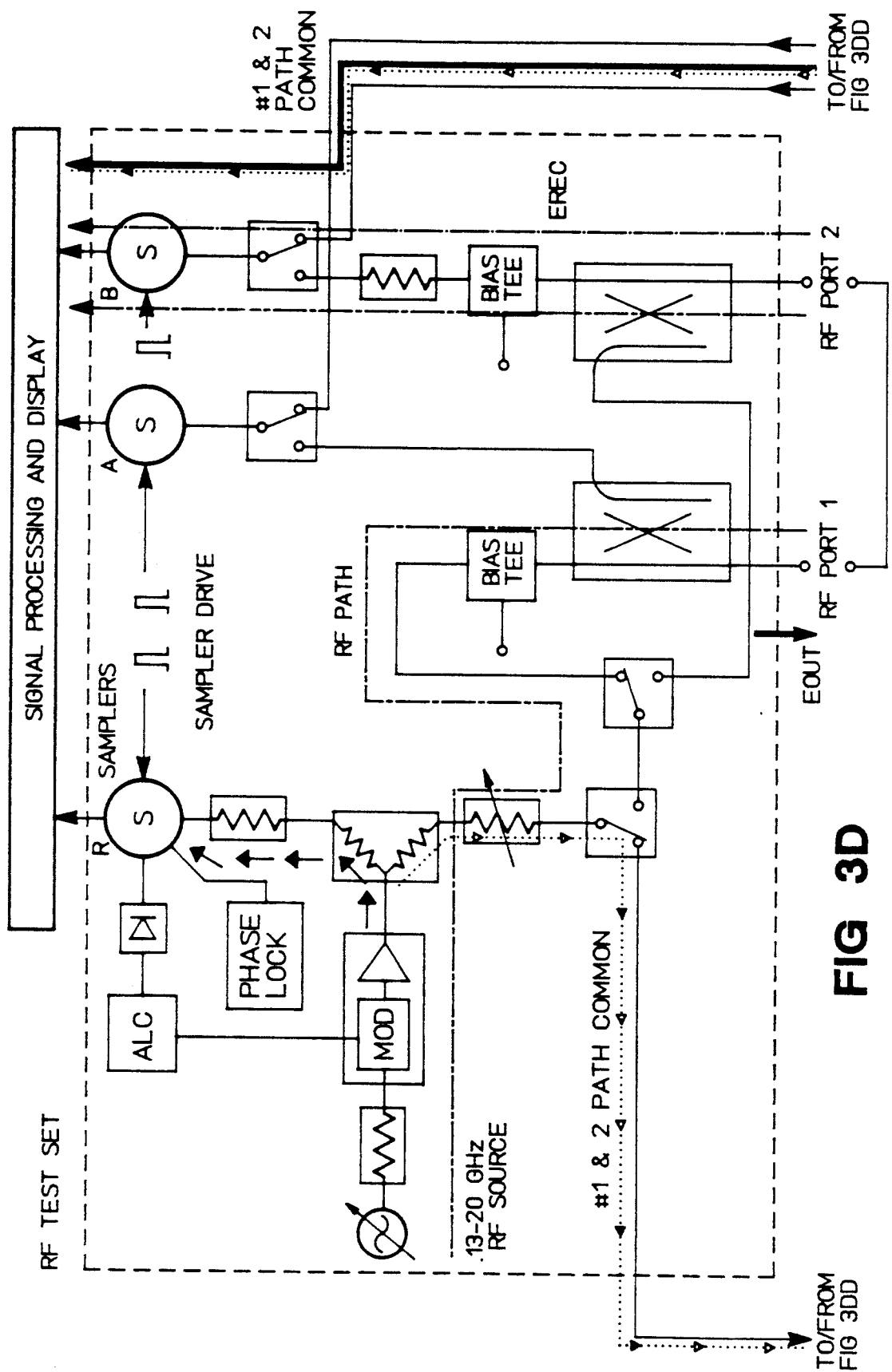
Figure 3D:
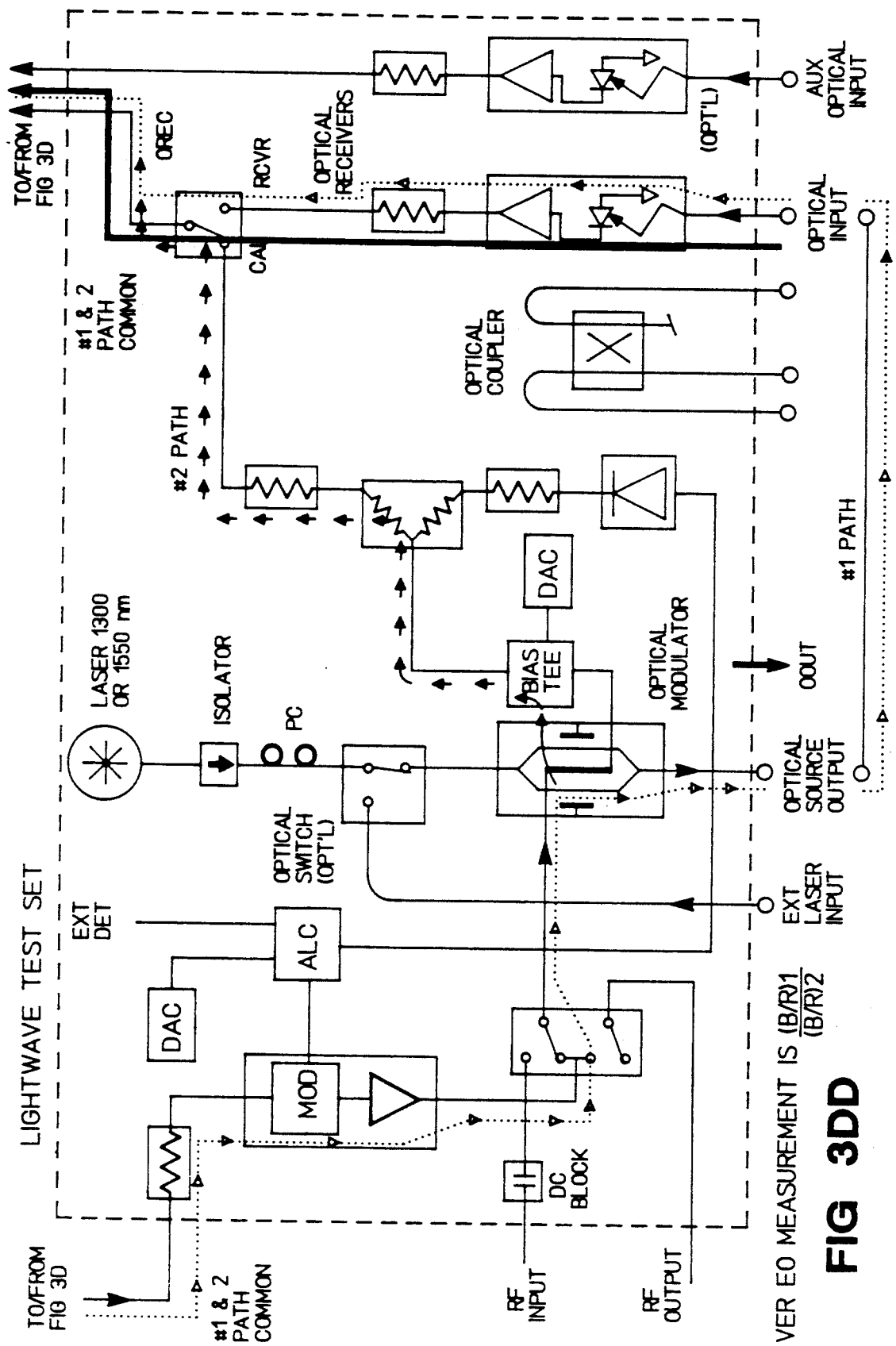

The fourth measurement is an "E/O CAL" measurement and is the ratio of the calibration RF path used for internal calibration of the optical source modulation and the optical path of modulator-to-receiver and hence to B- and R- channels, as shown in FIGS. 3D-3DD. This measurement is compared to the stored measurement to monitor the reference RF calibration path and the critical optical reference paths of the lightwave component analyzer 20.

Considered in more detail, each of these measurements is performed at the time of initial calibration and stored on a verification disc under respective file titles "VEROO," "VER12," "VER21," and "VEREOCAL." The disc is then shipped with the lightwave component analyzer 20.

The disc contents represent instrument states and measurement data of the unique characteristics of the internal measurement paths of the lightwave component analyzer 20, which are initially determined at the time of factory calibration. Then, these four files are later recalled from the disc to verify all measurement paths used in electro-optical measurements. The first file verifies the optical path. The second and third files verify the forward and reverse electrical paths. The fourth file verifies the internal calibration path and the optical path used in E/O measurements. In the field, after each file is recalled (which recalls an instrument state and a memory trace), a measurement is performed. Each file recalled automatically sets the lightwave component analyzer 20 to the instrument state required for the generation of measurement data. The factory stored data are loaded in memory, and a new measurement is performed using the RF and optical thru cables 12' and 22, respectively. The verification process is a matter of recalling the files and comparing the newly measured thru data with the stored thru measurement data. The disc also preferably has pre-defined limits that account for allowable system drift and measurement repeatability. The new measurements are compared to the stored limit lines. If the new measurements fall within the allowed limits, a pass condition is indicated to provide a verification of that particular measurement path. Verification is achieved by establishing a pass condition for all four setup measurements.

Figure 4:
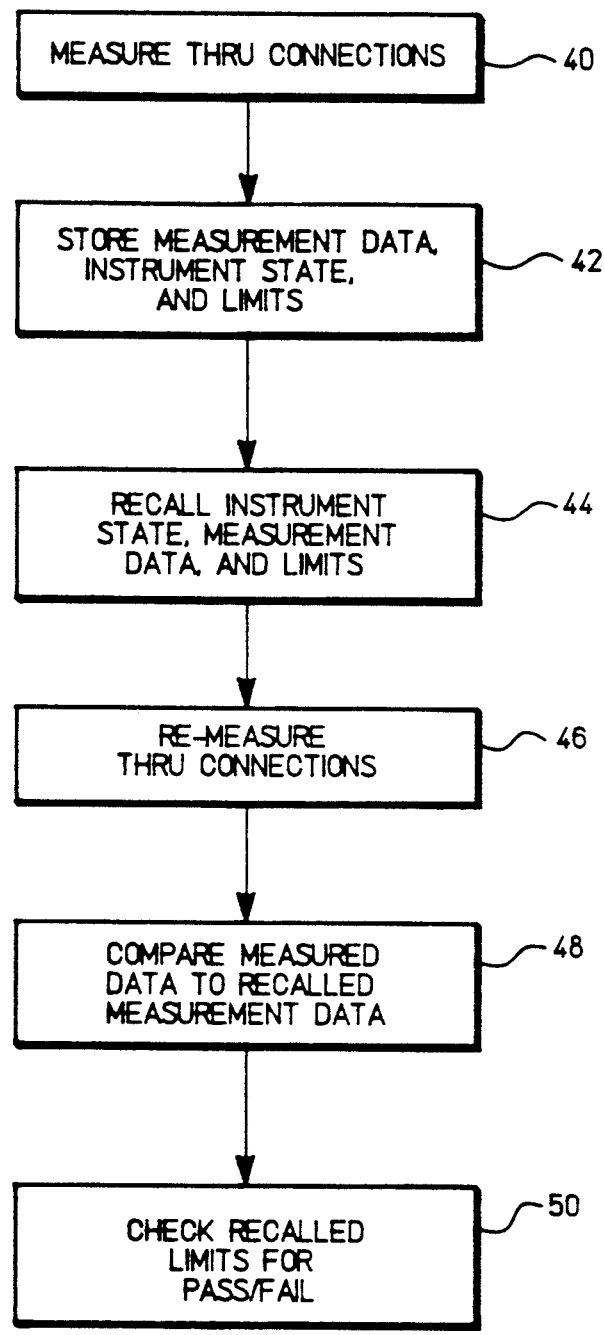
FIG. 4 is a flow chart of one implementation of the lightwave component analyzer verification method in accordance with the invention.
Figure 5A:
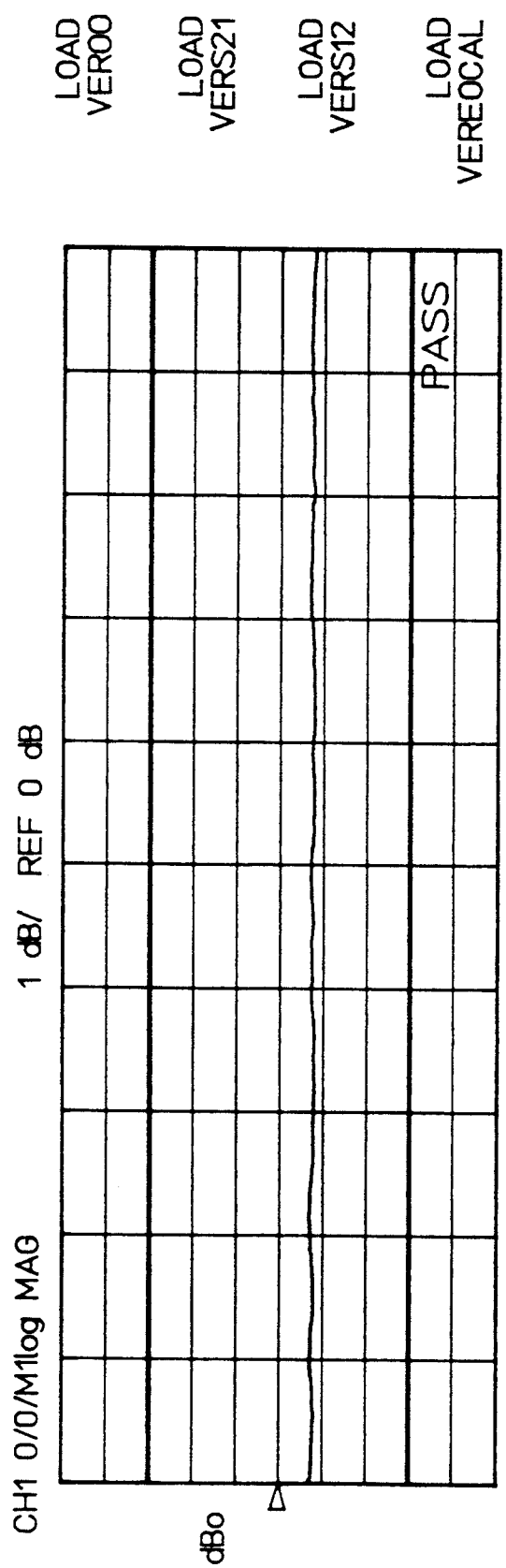
FIG. 5, comprising FIGS. 5A-5AA and FIGS. 5B-5BB, illustrates sample lightwave component analyzer displays for verification measurements.
Figure 5A:
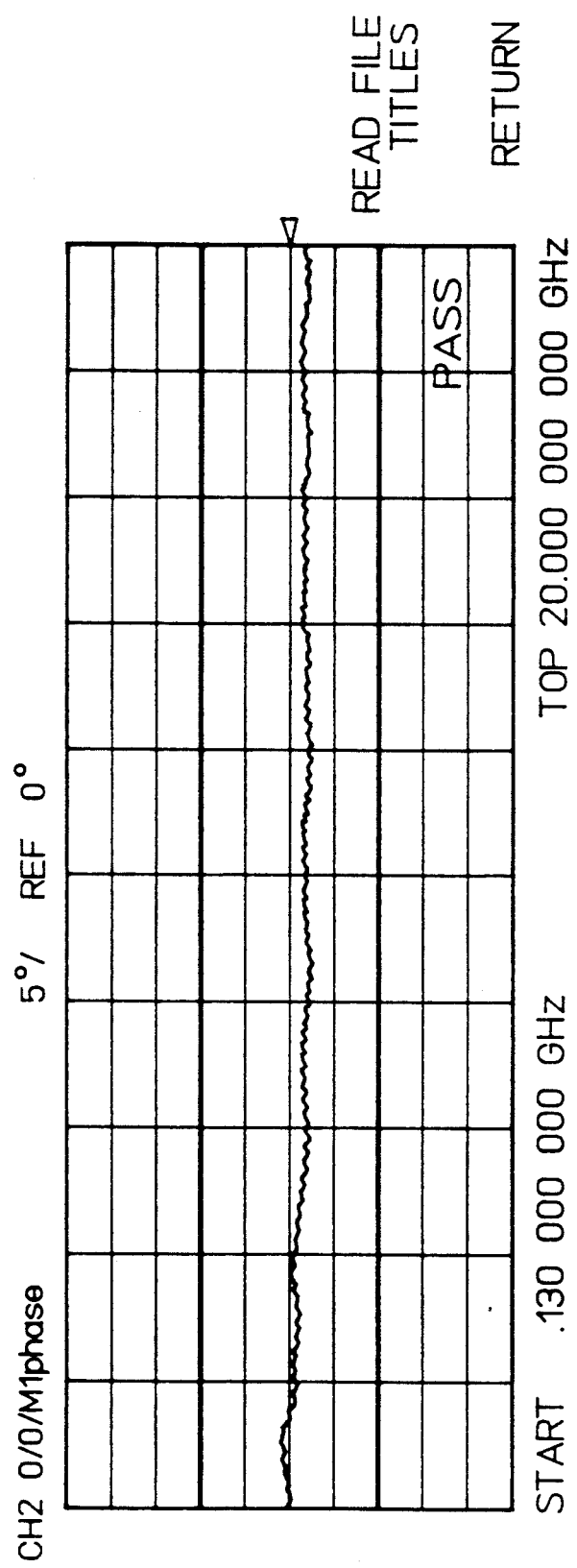

More specifically, at the time of factory calibration, a measurement is performed on the hardware that represents an absolute measurement of the critical portions of the measurement in the lightwave component analyzer 20. The only external connections needed are RF and optical thru connections to close the measurement paths, as indicated by the numeral 40 shown in FIG. 4. The absolute measurement data, along with instrument setup information and prescribed limit lines (that account for the allowable drift and repeatability of the measurements), are stored on a disc for the HP 8703A lightwave component analyzer and on a BASIC program disc for the HP 83420 lightwave test set, as indicated by the numeral 42 in FIG. 4, and shipped with the hardware. At the time of verification, the thru connections are again made, and the instrument setup, measurement data, and limit lines are recalled, as indicated by the numeral 44 in FIG. 4. Then, a new measurement is performed and compared to the original to verify that it is within the allowable limits, as indicated by the numerals 46, 48, and 50, respectively, shown in FIG. 4, and the comparison can be displayed, as shown in FIGS. 5A and 5AA and FIGS. 5B and 5BB. If it is outside the limits, verification fails, and the user will be advised to check the quality of the cables and connections being used. If that check does not alleviate the out of limits condition, the lightwave component analyzer 20 will be considered out of specification and must be returned for repair and/or recalibration.

The following describes one specific implementation of the method in accordance with the invention to generate verification files for the HP 8703A lightwave component analyzer. The first part of the verification is mostly controlled by a disc program. The second part requires the user to interact with the program extensively.

Figure 6:
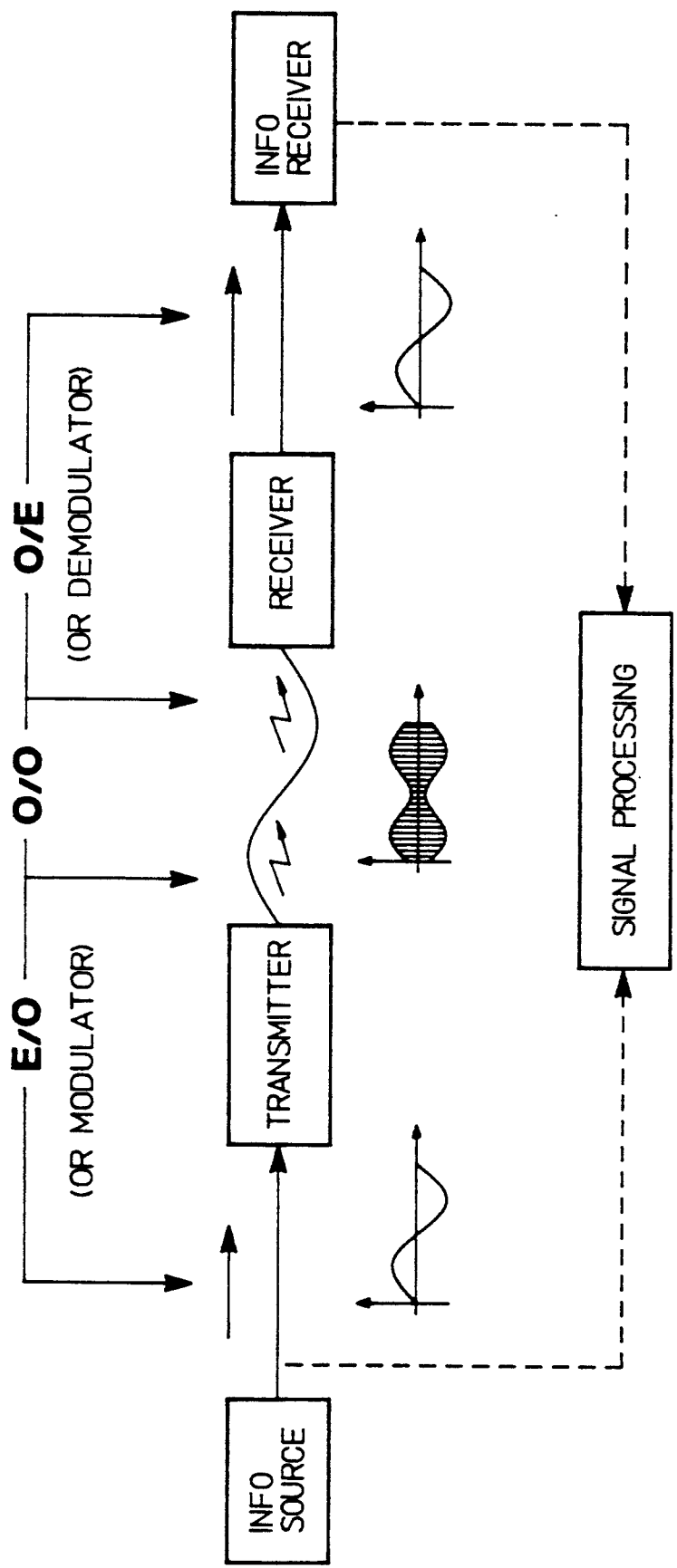
FIG. 6 is a measurement block diagram of the lightwave component analyzer shown in FIG. 2.

By way of background, the HP 8703A lightwave component analyzer not only measures electrical parameters, but also measures electro-optical components, such as modulation characteristics of laser sources or demodulation characteristics of photodiode detectors. The basic measurement uses a calibrated E/O source and a calibrated O/E receiver as part of the measurement path and then substitutes an unknown device under test for its corresponding portion of the measurement loop, as shown in FIG. 6.

In order to provide this measurement capability, absolute calibration of the reference modulated laser source and reference photodiode receiver is necessary. In view of the 130 MHz to 20 GHz modulation bandwidth of the HP 8703A lightwave component analyzer, two calibration methods are preferably used at the factory or field service site (two-tone modulator measurements and dual heterodyne receiver measurements). These are complex measurements used in the factory or at the field service site to establish the initial calibration and do not constitute any part of this invention.

Now, the electro-optical measurements do not have calibration or verification reference components such as the user typically uses in the case of electrical measurements. In the case of electro-optical, opto-electrical, and optical measurements with the HP 8703A lightwave component analyzer, measurements are accomplished by storing reference calibrations of key portions of the measurement hardware. Measurement of an unknown device under test is then accomplished by a process of substitution (or subtraction) of the test device for system calibration data. Thus, each HP 8703A lightwave component analyzer accomplishes its measurements because the factory calibration process generates absolute calibration data unique to that set of hardware.

In accordance with the verification method of the invention, the disc which accompanies the HP 8703A lightwave component analyzer is prepared with four instrument states saved, namely, a) O/O Measurement—filename VEROO, b) $S_{21}$ Measurement—filename VER21, c) $S_{12}$ Measurement—filename VER12, and d) E/O CAL Measurement—filename VEREOCAL. Each instrument state consists of the following: 130 MHz to 20 GHz linear frequency sweep; 1601 points; Display Data/Memory 1; Memory 1 trace containing factory measurement of one of the four parameters; continuous sweep; NO data arrays (i.e., Raw, Data, Format, Graphics) are stored; limits for the parameter being measured; limit lines ON; and limit test ON. The disc also contains thru measurement data and limits.

To perform verification, the user:
1) Connects the disc drive.
2) Inserts the disc into the disc drive.
3) Connects the RF cable (RF thru connection) between PORT 1 and PORT 2.
4) Connects the optical cable (optical thru connection) between OPTICAL SOURCE and OPTICAL INPUT.
5) To set-up the HP 8703A lightwave component analyzer as the controller, he or she presses the LOCAL key and then the SYSTEM CONTROLLER softkey.
6) Presses the RECALL key.
7) Presses the LOAD FROM DISC softkey.
8) Presses the READ FILE TITLES softkey.
9) Presses the softkey labelled 'VEROO.' The file recalled measures the optical path and compares the measurement to the factory-measured data.
10) The current measurement is divided by the factory measurement stored on disc. The pass/fail status of the verification for both magnitude and phase is indicated on the display of the lightwave component analyzer.
11) The lightwave component analyzer then displays whether verification PASSes or FAILs.

Thereafter, steps corresponding to steps 9 through 11 are repeated for VER21, VER12, and VEREOCAL. That is, the user:

12) Selects the LOAD VER21 softkey. The file recalled measures the forward electrical path and compares the measurement to the factory-measured data. The pass/fail status of the verification for both magnitude and phase is indicated on the display of the lightwave component analyzer.
13) Selects the LOAD VER12 softkey. The file recalled measures the reverse electrical path and compares the measurement to the factory-measured data. The pass/fail status of the verification for both magnitude and phase is indicated on the display of the lightwave component analyzer.
14) Selects the LOAD VEREOCAL softkey.

An additional file is stored for testing a section of the lightwave path. This file contains an instrument state with the following:

1) The Memory 1 trace contains the factory measurement of O/O divided by the E/O CAL parameter.
   a) Measure E/O CAL parameter.
   b) Data→Memory 1.
   c) Measure O/O parameter.
   d) Display Data/Memory 1.
   e) Math→Memory 1.
2) E/O CAL parameter.
3) Display Data and Memory.
4) The limit lines are entered and ON.
5) The limit test is OFF.
6) Store to disc as 'VEREOCAL.'

To perform verification, the user:
1) Presses the RECALL key.
2) Presses the LOAD FROM DISC softkey.
3) Presses the READ FILE TITLES softkey.
4) Presses the softkey labelled 'VEREOCAL.'
5) The current measurement of the E/O CAL parameter is displayed with the Memory 1 trace of factory measurement of O/O divided by E/O CAL.
6) Presses the DISPLAY key.
7) Presses the SELECT DEFAULTS softkey.
8) Presses the MEMORY 1→MEMORY 2 softkey.
9) Presses the RETURN softkey and waits for one complete sweep.
10) Presses the DATA→MEMORY 1 softkey.
11) Presses the MEAS key.
12) Presses the Trans: O/O softkey.
13) Presses the DISPLAY key.
14) Presses the SELECT DEFAULTS softkey and waits for one complete sweep.
15) Presses the MATH→MEMORY 1 softkey.
16) Presses the RETURN softkey.
17) Presses the MATH: DATA/MEM softkey.
18) Presses the MORE softkey.
19) Presses the MEM1/MEM2 softkey.

To run the limit test on channel 2, the user:

20) Presses the SYSTEM key.
21) Presses the LIMIT MENU softkey.
22) Presses the LIMIT TEST ON softkey to turn on the limits.
23) The verification PASS or FAIL is displayed.
24) To run the limit test on channel 1, the user presses the CH 1 key, followed by the LIMIT MENU softkey and then the LIMIT TEST ON softkey.

Figure 5B:
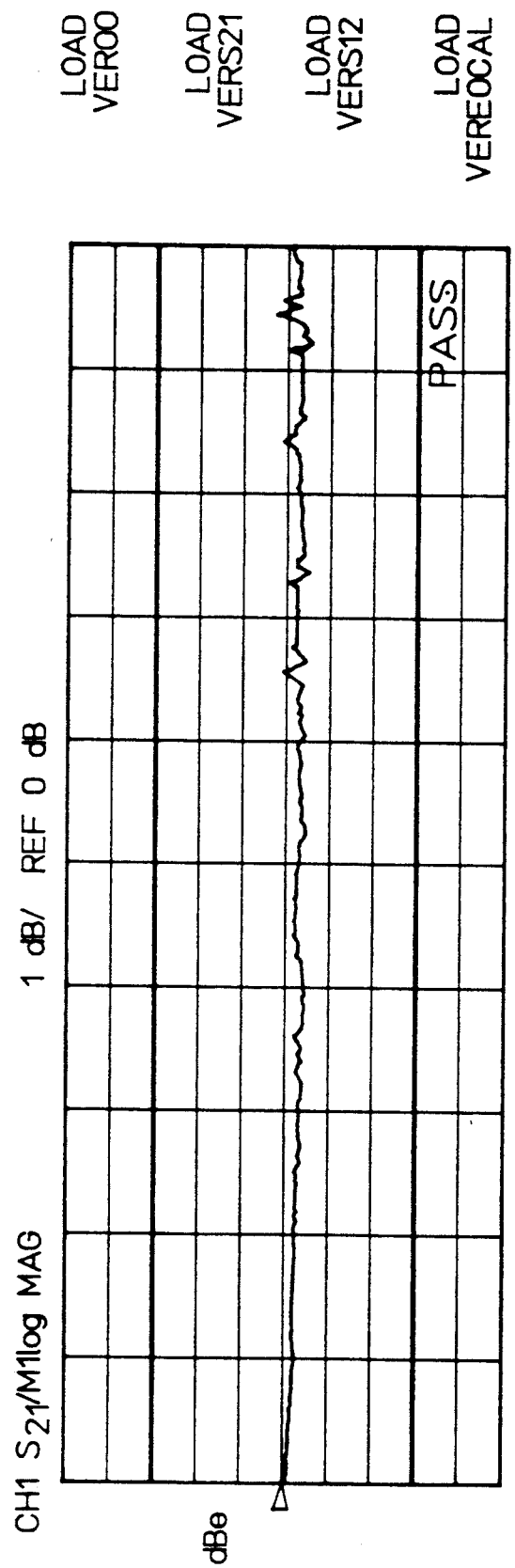
Figure 5B:
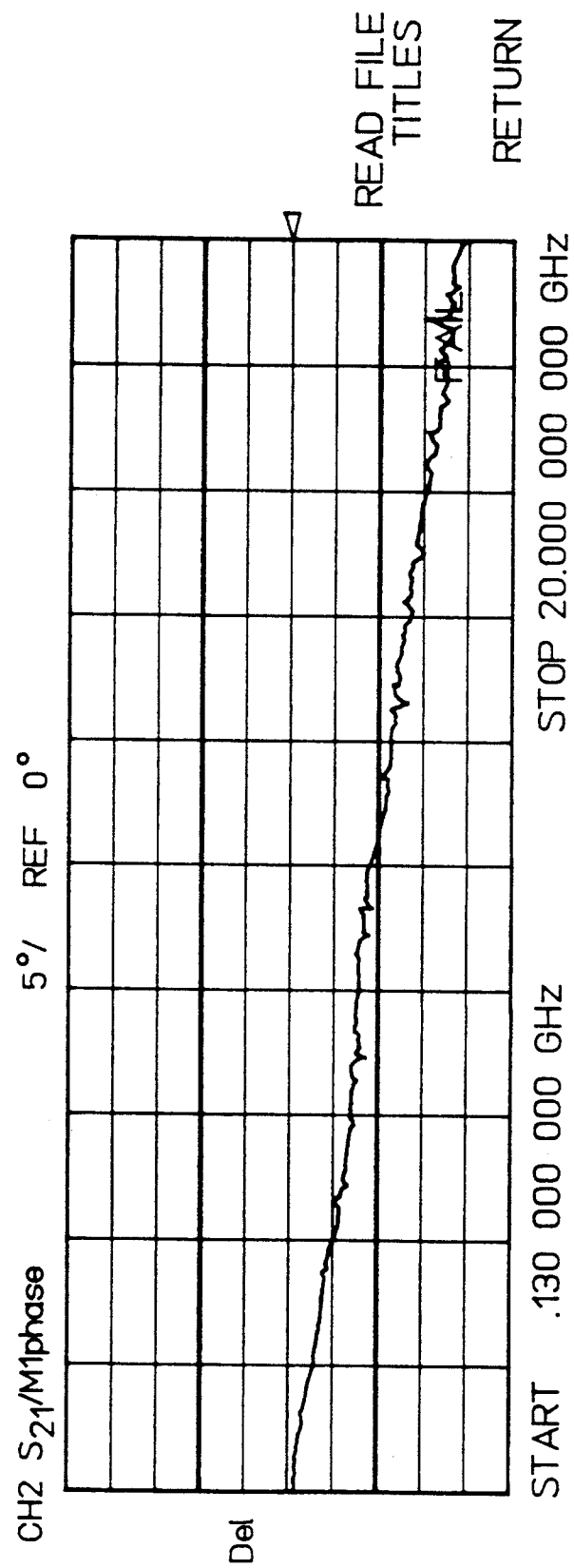

The limit lines displayed on the display of the lightwave component analyzer are the boundaries that the test uses to compare the measurement to the factory-measured data, as shown in FIGS. 5A and 5AA and FIGS. 5B and 5BB. The pass/fail status of the verification for both magnitude and phase is indicated on the display of the lightwave component analyzer, as shown by a comparison of FIG. 5B with FIG. 5BB.

If any portion of the test fails, the verification is not confirmed. The user then cleans all the optical cable ends and connectors and assures that the connections are finger tight, and then he or she runs the optical verification again. If the lightwave component analyzer still does not pass the verification, the user presses the PRESET key to run a "self test." If the self test does not pass, the lightwave component analyzer requires maintenance or repair.

In addition, if the particular HP 8703A lightwave component analyzer has the option of two receivers, this presents the possibility of measuring two optical path states and thus monitoring where possible optical component drift or a failure is occurring. In addition to the frequency response verification, the full verification of the lightwave component analyzer 20 also includes absolute optical measurements of power and wavelength. These measurements can be performed by a power meter and a wavemeter.

The optical system verification monitors the long term stability and repeatability of the factory calibration. The verification process compares measurements of the current system status against factory measured data.

Thus, the verification approach is to provide the user with a measurement of the absolute characteristics of the critical measurement path made at the time of calibration. The integrity of the measurement system is then monitored over time by the ability to reproduce the original absolute characteristics measured at the factory. This will provide the user with a simple measurement that monitors the system status linked directly to its original calibration.

The verification method in accordance with the invention has additional benefits. The simplicity of the procedure encourages the user to perform this procedure upon initial receipt of the test and measurement system to assure the system calibration integrity. The verification method also provides a powerful system diagnostic tool. If changes in hardware occur, monitoring the changes from the time of manufacture can be a powerful troubleshooting tool. Furthermore, the fact that the user can monitor system changes over time from calibration results in the possibility that the system could use this information to alter its original calibration to account for long term drift factors in measurement accuracy.

Finally, it is noted that electrical (E/E) measurements in the HP 8703A lightwave component analyzer are preferably verified by the conventional verification technique using reference components of a verification kit, although this is not required. Also, in the HP 8703A lightwave component analyzer, the paths measured always combine an optical source and receiver. In establishing confidence in the verification, the user must consider such factors as whether one part of the system changes one direction and another part the opposite direction. Also, the degree of confidence relates to the test limits accounting for the change in one optical component drift or both. Considering the characteristics of the system performance and making reasonable predictions of the sources of potential hardware performance changes still results in a method that gives a high level of confidence and addresses an otherwise very difficult verification situation.

The foregoing description is offered primarily for purposes of illustration. Other types of measurements that require unusual or absolute calibration (possibly, for example, in the area of translated frequency measurements) that are not easily confirmed by recognized verification devices could take advantage of this approach. While a variety of embodiments has been disclosed, it will be readily apparent to those skilled in the art that numerous other modifications and variations not mentioned above can still be made without departing from the spirit and scope of the invention as claimed below.

What is claimed is:

1. A verification method for monitoring hardware performance of a network analyzer system, used to perform electrical measurements, to detect deviations, or changes, over time as compared to the system status at the time of factory or other reference calibration, comprising the steps of:

providing an initial calibration for the system during a first time period;

connecting an RF cable between an RF signal output port and an RF signal input port during the first time period after the initial calibration of the system;

performing a measurement on the RF cable and an associated measurement path in the system during the first time period to produce first RF thru measurement data comprising an RF thru measurement trace of the system measured using the RF cable during the first time period;

storing the first RF thru measurement data;

disconnecting the RF cable;

reconnecting the RF cable between the RF signal output port and the RF signal input port during a second time period after the first time period;

repeating a measurement on the RF cable and the associated measurement path in the system during the second time period to produce second RF thru measurement data comprising an RF thru measurement trace of the system measured using the RF cable during the second time period; and comparing the first and second RF thru measurement data, without modifying the initial calibration for the system, to determine differences therebetween to indicate whether the system is reproducing the RF thru measurement conditions determined during the first time period when it is initially calibrated.

2. The verification method of claim 1 wherein the first RF thru measurement data are stored in system memory.

3. The verification method of claim 1, further comprising the step of:

displaying the comparison of the first and second RF thru measurement traces of the system measured using the RF cable during the second time period.

4. The verification method of claim 1, further comprising the steps of:
setting a range of allowable deviation of the second RF thru measurement data from the first RF thru measurement data for establishing limits within which the first and second RF thru measurement data are permitted to differ; and
providing a pass indication if the limits are not exceeded;
thereby verifying that the network analyzer continues to operate within a predetermined acceptable range with respect to its initial calibration state.

5. The verification method of claim 4 wherein the limits are modified based on measurement repeatability.

6. The verification method of claim 4 wherein the limits are modified based on normal system drift.

7. A verification method for monitoring hardware performance of a lightwave component analyzer system, used to perform electrical, electro-optical, opto-electrical, and optical measurements, to detect deviations, or changes, over time as compared to the system status at the time of factory or other reference calibration, comprising the steps of:
providing an initial calibration for the system during a first time period;
connecting an RF cable between an RF signal output port and an RF signal input port during the first time period after the initial calibration of the system;
connecting an optical cable between an optical signal output port and an optical signal input port during the first time period after the initial calibration of the system;
performing a measurement on the RF cable and an associated measurement path in the system during the first time period to produce first RF thru measurement data comprising an RF thru measurement trace of the system measured using the RF cable during the first time period;
performing a measurement on the optical cable and an associated measurement path in the system during the first time period to produce first optical thru measurement data comprising an optical thru measurement trace of the system measured using the optical cable during the first time period;
storing the first RF thru measurement data and first optical thru measurement data;
disconnecting the RF cable;
disconnecting the optical cable;
reconnecting the RF cable between the RF signal output port and the RF signal input port during a second time period after the first time period;
reconnecting the optical cable between the optical signal output port and the optical signal input port during a second time period after the first time period;
repeating a measurement on the RF cable and the associated measurement path in the system during the second time period to produce second RF thru measurement data comprising an RF thru measurement trace of the system measured using the RF cable during the second time period;
repeating a measurement on the optical cable and the associated measurement path in the system during the second time period to produce second optical thru measurement data comprising an optical thru measurement trace of the system measured using the optical cable during the second time period; and
comparing the first and second RF thru measurement data and the first and second optical thru measurement data, without modifying the initial calibration of the system, to determine differences therebetween to indicate whether the system is reproducing the RF thru measurement conditions and optical thru measurement conditions determined during the first time period when it is initially calibrated.

8. The verification method of claim 7 wherein the first RF thru measurement data and the first optical thru measurement data are stored on a disc that is shipped with the system.

9. The verification method of claim 7, further comprising the step of:
displaying a comparison of the first and second RF thru measurement traces and the first and second optical thru measurement traces of the system measured using the RF cable and using the optical cable, respectively, during the second time period.

10. The verification method of claim 7, further comprising the steps of:
setting a range of allowable deviation of the ratio of the second RF thru measurement data to the first RF thru measurement data and the ratio of the second optical thru measurement data to the first optical thru measurement data for establishing limits within which the first and second RF thru measurement data and the first and second optical thru measurement data, respectively, are permitted to differ; and
providing a pass indication if the limits are not exceeded;
thereby verifying that the test and measurement system continues to operate within a predetermined acceptable range with respect to its initial calibration state.

11. The verification method of claim 10 wherein the limits are modified based on measurement repeatability.

12. The verification method of claim 10 wherein the limits are modified based on normal system drift.

13. A verification method for monitoring hardware performance of a test and measurement system, used to perform at least one of electrical, electro-optical, opto-electrical, and optical measurements, to detect deviations, or changes, over time as compared to the system status at the time of factory or other reference calibration, comprising the steps of:
providing an initial calibration for the system during a first time period;
connecting at least one of an RF connecting means between an RF signal output port and an RF signal input port and an optical connecting means between an optical signal output port and an optical signal input port during the first time period after the initial calibration of the system;
performing a measurement on at least one of the RF connecting means and an associated measurement path, to produce first RF thru measurement data comprising an RF thru measurement trace of the system measured using the RF connecting means, and a measurement on the optical connecting means and an associated measurement path, to produce first optical thru measurement data comprising an optical thru measurement trace of the system measured using the optical connecting means, during the first time period;

storing at least one of the first RF thru measurement data and first optical thru measurement data;

disconnecting any previously connected connecting means;

reconnecting the at least one RF connecting means between the RF signal output port and the RF signal input port and the optical connecting means between the optical signal output port and the optical signal input port during a second time period after the first time period;

repeating a measurement on the at least one of the RF connecting means and the associated measurement path in the system, to produce second RF thru measurement data comprising an RF thru measurement trace of the system measured using the RF connecting means, and the optical connecting means and the associated measurement path in the system, to produce second optical thru measurement data comprising an optical thru measurement trace of the system measured using the optical connecting means, during the second time period; and comparing at least one of the first and second RF thru measurement data and the first and second optical thru measurement data, without modifying the initial calibration for the system, to determine differences therebetween to indicate whether the system is reproducing at least one of the RF thru measurement conditions and the optical thru measurement conditions determined during the first time period when it is initially calibrated.

14. The verification method of claim 13 wherein any measured first RF thru measurement data and first optical thru measurement data are stored on a disc that is shipped with the system.

15. The verification method of claim 13, further comprising the step of:
displaying a comparison of any measured first and second RF thru measurement traces and first and second optical thru measurement traces of the system measured using the RF connecting means and using the optical connecting means, respectively, during the second time period.

16. The verification method of claim 13, further comprising the steps of:
setting a range of allowable deviation of the second RF thru measurement data from the first RF thru measurement data and the second optical thru measurement data from the first optical thru measurement data for establishing limits within which any measured first and second RF thru measurement data and first and second optical thru measurement data, respectively, are permitted to differ; and
providing a pass indication if the limits are not exceeded;
thereby verifying that the test and measurement system continues to operate within a predetermined acceptable range with respect to its initial calibration state.

17. The verification method of claim 16 wherein the limits are modified based on measurement repeatability.

18. The verification method of claim 16 wherein the limits are modified based on normal system drift.

* * * * *